United States Patent [19]
Hollis, Jr.

[11] Patent Number: 5,153,494
[45] Date of Patent: Oct. 6, 1992

[54] ULTRAFAST ELECTRO-DYNAMIC X, Y AND THETA POSITIONING STAGE

[75] Inventor: Ralph L. Hollis, Jr., Yorktown Heights, N.Y.

[73] Assignee: International Business Machines Corp., N.Y.

[21] Appl. No.: 513,749

[22] Filed: Apr. 6, 1990

[51] Int. Cl.$^5$ .............................................. G05B 1/06
[52] U.S. Cl. ................................... 318/640; 318/687; 318/653
[58] Field of Search ................................ 318/560–653, 318/135, 687; 356/358; 355/133, 72; 310/12–14

[56] References Cited

U.S. PATENT DOCUMENTS

| | | | |
|---|---|---|---|
| 4,253,051 | 2/1981 | Schneider | 318/632 |
| 4,485,339 | 11/1984 | Trost | 318/640 |
| 4,506,204 | 3/1985 | Galburt | 318/38 X |
| 4,506,205 | 3/1985 | Trost et al. | 318/38 X |
| 4,507,597 | 3/1985 | Trost | 318/38 |
| 4,509,002 | 4/1985 | Hollis, Jr. | 318/687 |
| 4,514,674 | 4/1985 | Hollis, Jr. | 318/687 |
| 4,654,571 | 3/1987 | Hinds | 318/687 |
| 4,742,286 | 5/1988 | Phillips | 318/640 |
| 4,874,998 | 10/1989 | Hollis, Jr. | 318/568.21 |

FOREIGN PATENT DOCUMENTS 2087241 12/1971 France.
1301038 12/1989 Japan.
1325947 8/1973 United Kingdom.

OTHER PUBLICATIONS

K. Asakawa, et al., "A Variable Compliance Device and its Application for Automatic Assembly," Autofact 5 Conference Proceedings, Detroit, MI, pp. 10-1 to 10-17 (Nov. 14-17, 1983).
R. H. Taylor, et al., "Precise Manipulation with Endpoint Sensing," IBM Engineering Technology Research Report No. RC 10670 (#47860) (Aug. 7, 1984, later published in IBM J. Res. Develop. vol. 29, No. 4, pp. 363-376 (Jul. 1985).
Ralph L. Hollis, Jr., "A Planar XY Robotic Fine Positioning Device," Proc. 1985 IEEE International Conference on Robotics and Automation, St. Louis, MO, pp. 329-336 (Mar. 25-28, 1985).
R. H. Taylor, et al., "Precise Manipulation wtih Endpoint Sensing," IBM J. Res. Develop. vol. 29, No. 4, pp. 363-376 (Jul. 1985), and earlier published as IBM Engineering Technology Research Report No. RC 10670 (#47860) (Aug. 7, 1984).
Ralph L. Hollis, Jr., et al, "Robotic Circuit Board Testing Using Fine Positioners with Fiber–Optic Sensing," IBM Engineering Technology Research Report, No. RC 11164 (#50243) pp. 1-14 (May 21, 1985).
Ralph L. Hollis, Jr. "Design for a Planar XY Robotic Fine Positioning Device," PED-vol. 15: Robotics and Manufacturing Automation, Winter Annual Mtg. of the ASME, Miami Beach, FL, pp. 291-298 (Nov. 17-22, 1985).
"Non-Contact Sensor for Two-Dimensional Translation and Rotation," IBM Technical Disclosure Bulletin, vol. 30, No. 7, pp. 33-34 (Dec. 1987).

*Primary Examiner*—Paul Ip

[57] ABSTRACT

The invention discloses an Ultrafast Electro-Dynamic X, Y and Theta Positioning Stage. A positioning stage made according to this invention allows light payloads to be moved with extremely high linear and angular accelerations over finite distances and angles with a plane. An important feature of this invention is a momentum-cancelling design which allows reaction forces and torques on the fixed member to approach zero, thereby, allowing for a smooth and an ultrafast performance by the positioning stage.

50 Claims, 4 Drawing Sheets

ULTRAFAST ELECTRO-DYNAMIC X, Y AND THETA POSITIONING STAGE

FIELD OF THE INVENTION

This invention relates generally to a precision positioning stage and more specifically to an Ultrafast Electro-Dynamic X, Y and Theta Positioning Stage which is capable of moving light payloads with extremely high linear and angular accelerations over finite distances and angles within a plane. A unique feature of this positioning stage is the momentum-cancelling design which allows reaction forces and torques on the fixed member to approach zero.

BACKGROUND OF THE INVENTION

The need for precision positioning is well known in a number of mechanical and electronic arts. Close tolerance machining, for example, requires that the tool be positioned exactly. Various mechanisms for accomplishing such positioning, and various techniques for getting the most out of such mechanisms, are known.

A known mechanism for accomplishing precision positioning within a plane is the use of a linear motor to drive and hold a device in a particular position. Such linear motors, as well as electro-mechanical stepping motors, hydraulic actuators, and other mechanisms are known for use in precision positioning.

A typical solution to the need for high precision motion, in a plane of scanning for a robot end effector, is to provide a pair of linear actuators mechanically connected in tandem so that the Y-actuator is physically carried at the end of the X-actuator. A disadvantage of this approach is that the Y and X stages are mechanically in series, the Y stage moves the payload, but the X stage must move both the Y stage and the payload. Symmetry is broken, and in critical applications the control strategies for the X stage and the Y stage must be different for the different dynamics involved. Theta motion (rotation about an axis orthogonal to X and Y) may require still another tandem stage.

There are many applications where it is often necessary to move small payloads over limited distances with high speed and precision. Some of these applications include: scanning microscopy, lithography, robotic assembly and automatic testing.

In scanning microscopy, one must raster scan a sample beneath a small probe. The probe may be optical, capacitive, acoustic, magnetic, tunneling current, etc. The resulting time series signal becomes a two-dimensional image of the sample. In order to obtain the image in a very short time, the scanning stage must be exceedingly fast.

In lithography, one must quickly align a mask and substrate, involving precise motions in X, Y and theta.

Similar considerations apply to robotic assembly where two parts, or a part and a workpiece, must be aligned. In robotics, it is often desirable to tailor the compliance as well to accommodate misalignments and variation in parts dimensions. A promising technique in robotics is to use a combined coarse-fine motion approach where a fine positioning device is carried by a coarser positioning device, to achieve a large workspace envelope without sacrificing resolution.

In automatic testing, electrical or other kinds of probes are moved to discrete electrical connection pads on chips or modules whereupon a test is performed. In production, thousands of tests must be completed in a short time to make the process economically attractive.

This invention will fulfill requirements in applications where it is necessary to move light payloads over limited distances with high speed and precision.

Traditional solutions to this problem involve a stack of linear and rotary translation stages powered by motor-driven lead screws. The motors are either open-loop steppers or closed loop DC servos. Typically, either ball or crossed roller bearings are used for suspension. Recently, direct-drive linear motors have been used to eliminate the lead screws. These motion systems are all characterized by reasonably high accuracy, good load carrying capacity, but very low peak accelerations and velocities.

An improved motion device, light and small enough to be attached to the terminal link of an industrial robot was disclosed in U.S. Pat. No. 4,509,002, "Precision X-Y Positioner," by Ralph L. Hollis Jr., and U.S. Pat. No. 4,514,674, "Electromagnetic X-Y-Theta Precision Positioner," by Ralph L. Hollis Jr. and Bela L. Musits.

The device and several automation applications are described in R. H. Taylor, R. L. Hollis, and M. A. Lavin, "Precise Manipulation with Endpoint Sensing," presented at International Symposium on Robotics Research, Kyoto, Japan, Aug. 20-23, 1984, and published as an Engineering Technology Research Report No. RC 10670 (#47860) Aug. 7, 1984, which was later published in the IBM J. Res. Develop. Vol. 29, No. 4, pp. 363-376 (July, 1985).

Engineering details of the above-mentioned X-Y Positioner have been discussed by Ralph L. Hollis, in "A Planar XY Robotic Fine Positioning Device", Proc. 1985 IEEE International Conference on Robotics and Automation, St. Louis, Mo., pp. 329-336 (Mar. 25-28, 1985) and also in R. L. Hollis, "Design for a Planar XY Robotic Fine Positioning Device," PED-Vol. 15: Robotics and Manufacturing Automation, Winter Annual Mtg. of the ASME, Miami Beach, Fla., pp. 291-298 (Nov. 17-22, 1985).

R. L. Hollis, et al., "Robotic Circuit Board Testing Using Fine Positioners with Fiber-Optic Sensing," IBM Engineering Technology Research Report, No. RC 11164 (#50243) pp. 1-14 published on May 21, 1985, describes the use of a fine motion device to test electrical circuit boards.

The motion devices cited in these references exhibit moderately high speed and accelerations (240 mm/sec and 8.7 g force), high precision (0.5 microns motion resolution), limited travel (+/− 0.9 mm and +/− 2 degree.) and moderate payload capability (normally 1 Kg or less).

Additional work relating to the present invention has been disclosed by Kazuo Asakawa, Fumiaki Akiya, and Fumio Tabata, in their paper entitled "A variable Compliance Device and its Application for Automatic Assembly," Autofact 5 conference Proceedings, Detroit, Mich. pp. 10-1 to 10-17 (Nov. 14-17, 1983). These authors describe a compliance mechanism with 2 active and 3 passive degrees of freedom. The active degrees of freedom use planar coils. No positioning feedback is used, and their device is not used for positioning, although some force feedback is used.

Another, related reference is U.S. Pat. No. 4,874,998, issued on Oct. 17, 1989, entitled "Six Degree-of-Freedom Magnetically Levitated Fine Motion Device with Programmable Compliance", discloses a fine motion device having multiple degrees of freedom and being magnetically levitated. This fine motion device has programmable compliance as well as programmable motion.

Some of the common types of stages, such as, electromagnetic stages, have been disclosed in some of the above-mentioned references. The stage of the present invention is a different type of a stage, it is an electro-dynamic stage. An electro-dynamic stage is a stage where electrical currents in moving coils directly interact with constant magnetic fields to produce motive forces. In contrast, an electro-magnetic stage is a stage where electric currents in fixed coils alter magnetic fields in permeable materials to produce motive forces. The electro-dynamic stage of this invention not only moves in the X and Y direction, but also rotates, and because the moving element is supported by air bearings there is no static friction.

SUMMARY OF THE INVENTION

A precision positioning stage capable of executing multi-dimensional planar motion comprising at least one fixed assembly, and at least one moving element, wherein the moving element is configured to move with respect to the fixed assembly at high speed, and wherein the momentum of the moving element is instantaneously opposed, thereby providing the precision positioning stage.

A precision positioning stage capable of executing multi-dimensional planar motion comprising a first fixed assembly; a first moving element; a second fixed assembly, the first moving element being contained within the first and the second fixed assembly; a second moving element; and a third fixed assembly, such that the second moving element is contained within the second and the third fixed assembly, and wherein the first moving element is configured to move in a momentum cancelling manner with respect to the second moving element.

A precision positioning stage capable of executing multi-dimensional planar motion comprising a first fixed assembly; a first moving element; a second moving element; a second fixed assembly, such that the first and the second moving elements are contained within the first and the second fixed assembly, and wherein the first moving element is configured to move in a momentum cancelling manner with respect to the second moving element.

The precision positioning stage as discussed above would have the fixed assembly and the moving element form a motor, and wherein the motion of the moving element is measured by a sensor, and the sensor provides information to a controller means and wherein the controller insures that a desired motion is achieved.

BRIEF DESCRIPTION OF THE DRAWINGS

The features of the invention believed to be novel and the elements characteristic of the invention are set forth with particularity in the appended claims. The invention itself, however, both as to organization and method of operation, may best be understood by reference to the detailed description which follows taken in conjunction with the accompanying drawings in which:

FIG. 1 is an exploded perspective view of the positioning stage made according to this invention.

FIG. 2 is a perspective view of a partly assembled positioning stage with some elements removed and made according to this invention.

FIG. 3 is a cross-sectional elevational view taken along Section 3—3 of the positioning stage of this invention as shown in FIG. 2.

FIG. 4 is a perspective view of an assembled positioning stage made according to this invention.

DETAILED DESCRIPTION OF THE INVENTION

The basic invention idea is a synergistic and novel combination of planar magnetic coil actuators, air bearing constrainment and cooling means, position sensing, and control means to produce a stage capable of moving with extremely high translational and rotational accelerations in the plane without imparting recoil forces to the external mechanical interface.

The invention consists of several flat-wound or planar coils operating in magnetic fields produced by permanent magnets arranged to produce actuation forces in the plane and actuation torques perpendicular to the plane. Two sets of coils are sandwiched between two pairs of thin lamina constrained by air bearings on both sides. This comprises a device with a fixed housing or frame plus an identical pair of planar moving elements. The position and angle of each moving element is measured by sensors and is controlled by analog or digital means in such a manner that for each motion of one of the moving elements, the opposite motion is executed for the other element. This results in nearly complete cancellation of forces and torques seen outside of the system. For convenience, one of the moving elements will be called the primary element, and the other the recoil element. Additionally, either of the moving elements could be the primary moving element and the remaining can be termed the recoil moving element. The primary moving element does the useful work (e.g. moving a sample or tool in space) and, because of its extremely high dynamic performance it possesses high linear and angular momentum. Without the recoil moving element, equal and opposite momenta would be delivered to the frame (mechanical ground), causing a kick and resulting vibrations that are induced. The recoil moving element however, is controlled in such a manner to give an equal and opposite kick, (i.e. momenta which are opposite to those of the primary moving element), so the residual momenta transferred to the frame can approach zero.

The near absence of recoil becomes extremely important for programmable automation applications where coarse-fine positioning is used—that is, where a robot is used to carry the high performance positioning stage, to prevent disturbances from the fine motion stage from affecting the motion of the coarse motion robot.

A minimum of three coils is required to achieve 3 degree-of-freedom motion in the plane. However, four, five, six or more coils may be advantageous in certain instances.

In order to illustrate the nature of the invention, a preferred embodiment is shown in FIGS. 1 through 4, which is made according to the teachings of this invention. For control simplicity and ease of understanding, a four-coil or four-star configuration was chosen. Many other designs are possible without departing from the spirit or intent of this invention.

Figure 1:
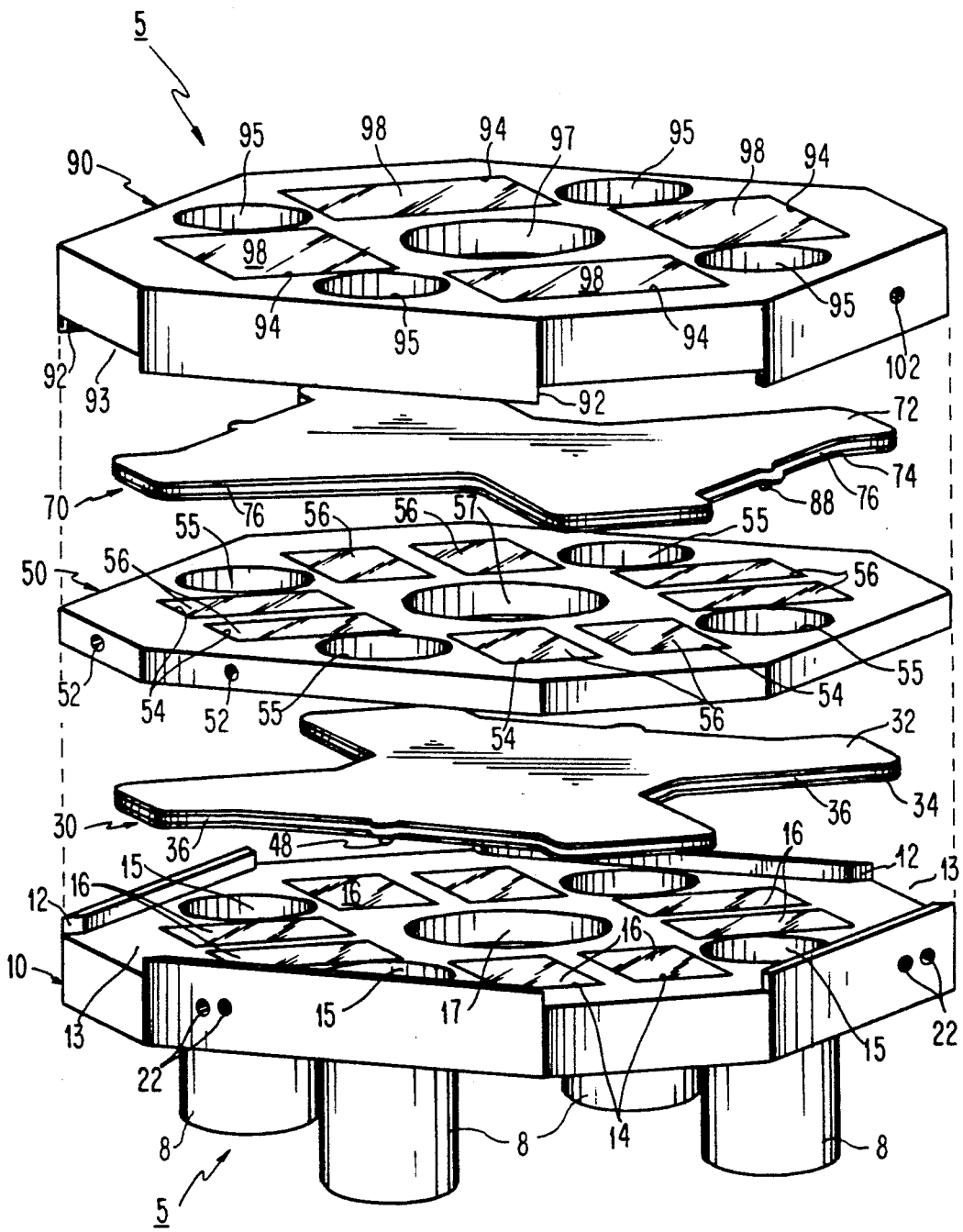
FIGS. 1 through 4, are one embodiment of the invention and wherein specifically.
Figure 2:
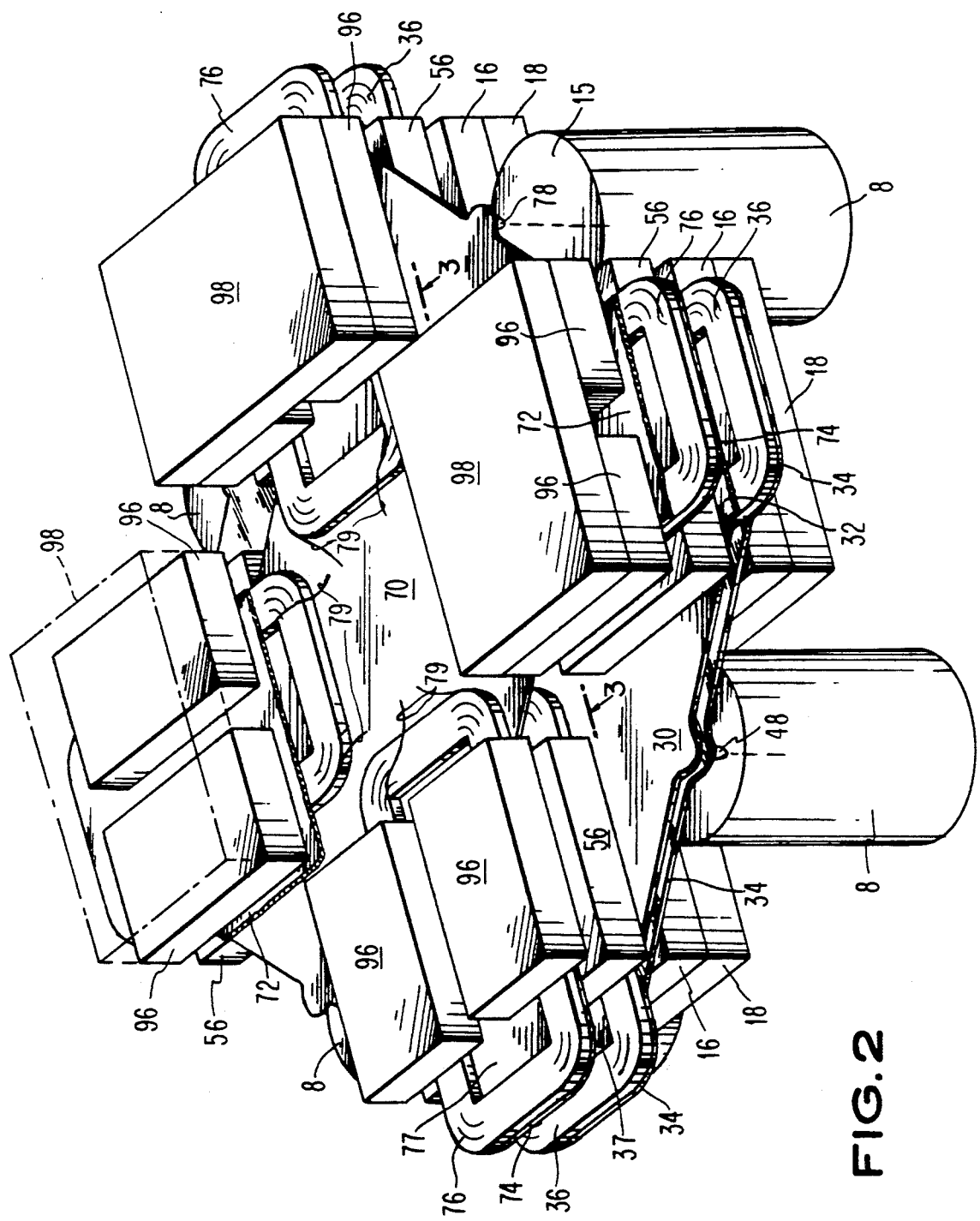

An exploded perspective view of the device assembly is shown by FIG. 1, and an interior view with portions of the upper and middle housings removed is shown in FIG. 2. Here in FIG. 2, all housings and the upper return plates on the left half have been removed to show the magnet assemblies. The upper sheet of each moving element sandwich has also been removed on the left half so that the magnet-coil relationships can be easily visualized.

As more clearly shown in FIG. 1, the Ultrafast Electro-Dynamic X, Y and Theta Positioning Stage 5, has a lower assembly or frame 10, made from a non-magnetic material and having openings 14, to accommodate, a return plate 18, (not shown in FIG. 1) and lower magnets 16. The lower magnets 16, are preferably permanent magnets but other electromagnets could also be used. The return plate 18, is made from a magnetically permeable material, such as iron. At the periphery of the lower frame 10, lower spacers 12, are formed to define the space in which the lower or recoil moving element 30, can operate. The height or thickness of the lower spacer 12, is equal to the thickness of the lower moving element 30, plus the thickness of the air gaps below and above the lower moving element 30; this is further illustrated in FIG. 3. The peripheral lower edge of the middle assembly or frame 50, sits or mates with the top surface of the lower spacer 12. The lower spacer 12, can be of any shape, such as rod, blocks, etc., and it can also having openings 13. The openings 13, of course would provide an exit for the air bearing. The opening 13, could be a continuous opening as shown, or a slotted type opening where the opening would have both a structural material and open areas. The lower frame 10, could also have attached to it one or more optical or other types of sensor 8. The lower frame 10, could also have one or more holes 15 and 17, to allow access to the lower surface of the lower sheet 34, of the lower or recoil moving element 30. One such hole is shown as the central access hole 17. The one or more openings 15, can also be used for the optical or electrical signal transmission.

Figure 3:
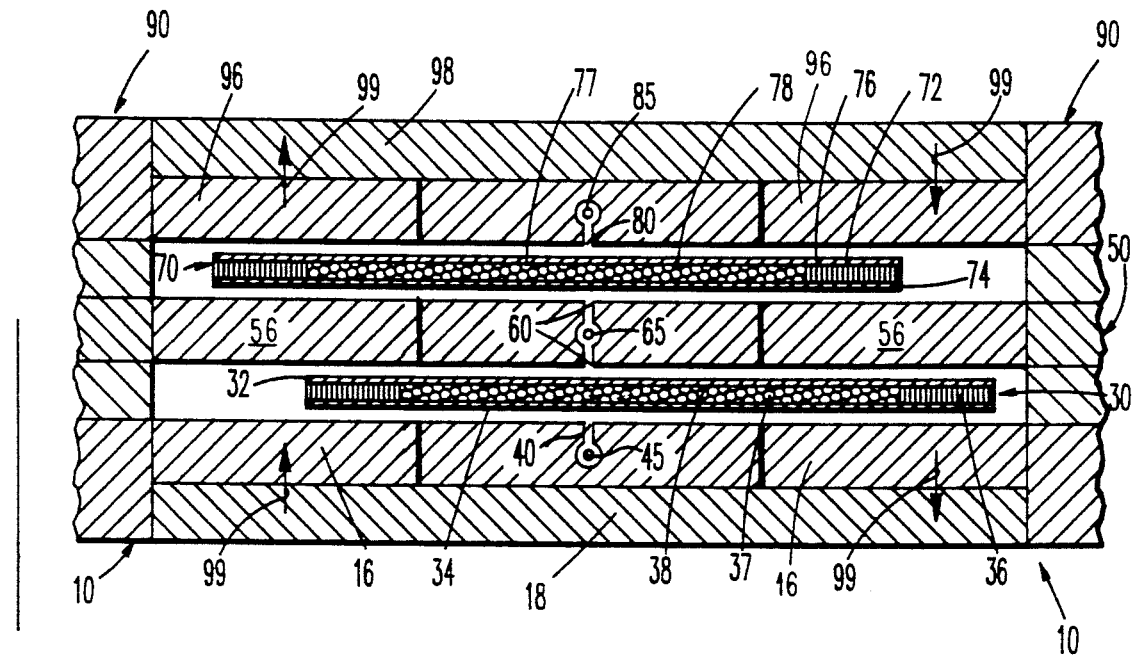

Next, a lower or recoil moving element 30, is placed strategically over the lower frame or lower fixed assembly 10, and is juxtapositioned in a friction minimizing manner. The whole lower moving element 30, floats or is suspended in air during operation. The first or recoil or lower moving element 30, comprises of different parts, for example, it has an upper sheet 32, and a lower sheet 34. Within the upper and lower sheets 32 and 34, there is an opening or a cavity 37. This opening or cavity 37, as shown in FIG. 3, which could be filled with a honeycomb or other lightweight structural material 38, and first or lower coil 36. The lower coil 36, is preferably wound on a non-magnetic mandrel and then the lower coil 36, is transferred and placed on the upper surface of the lower sheet 34. In some cases it may be preferred to place the lower coil 36, along with the non-magnetic manderal over the upper surface of the lower sheet 34. The upper and lower sheets 32 and 34, respectively, securely hold the structural material 38, and the coil 36. A glue or some kind of an adhesive or an epoxy or other bonding means could be used to securely hold together the lower sheet 34, upper sheet 32, and their contents. The sheets 32 and 34, are preferably made using graphite or Kevlar (Trademark of E. I. du Pont De Nemours & Co., Wilmington, Del., USA) or reinforced epoxy, but it could be glass reinforced epoxy or aluminum or titanium or beryllium. The lead wires (not shown), from the coil 36, would be routed to an analog or digital system (not shown) that controls the movement of the moving element 30. The analog or digital controller could be securely attached to the stage 5, or could be at a remote location. The wiring of course has to be securely attached and routed through the moving element 30, to insure proper electrical contact to the coil 36. The wires that connect the analog or digital controller to the coil 36, are preferably braided and have a low inductance.

The first or lower moving element 30, could also be made without the use of the upper and lower sheets, 32 and 34, respectively. In that event the exposed material 38, and the whole lower moving assembly 30, would be floating or suspended in operation.

The middle assembly or frame 50, consists primarily of a central access hole or opening 57, and openings 54 and 55. The one or more openings 55, in the middle frame 50, are used for the optical or electrical signal transmission. Within the openings 54, middle magnets 56, are preferably embedded. The middle magnet 56, is preferably a permanent magnet but it could be an electromagnet, additionally, the middle magnet 56, should preferably be of the same thickness as the middle frame 50. One or more of the openings 54, could instead be embedded with a magnetically permeable material, such as iron. The lower and upper surfaces of the middle magnets 56, are free to influence the lower moving element 30, and the upper moving element 70, respectively, so that at least one coil from each moving element shares the same magnetic field. The middle frame or assembly 50, separates the lower moving element 30, from the upper or second or primary moving element 70. The second or upper moving element 70, could also be made without the use of the upper and lower sheets, 72 and 74, respectively. In that event the exposed upper coil 76, would be held together by the structural material 78, as shown in FIG. 3, and the whole upper moving assembly 70, would be floating or suspended in air during operation.

The upper or second or primary moving element 70, is similar in structure as well is in mass as the lower moving element 30, and it is also juxtapositioned inside the precision positioning stage in a friction minimizing manner. The whole upper moving element 70, floats or is suspended in air during operation. In some situations, it may be necessary to vary the mass or the structure of either the first moving element 30 or the second moving element 70. The upper moving element 70, comprises an upper sheet 72, and a lower sheet 74. The cavity or opening 77, is similar to the cavity 37, and as stated earlier it could be filled with a structural material, such as a honeycomb or a lightweight structural material 78. The structural material 78, is sandwiched between the upper plate or sheet 72, and the lower plate or sheet 74, of the upper moving element 70. Within the upper and lower sheet 72, and 74, there are at least three upper coils 76. Similar to the lower coil 36, this coil 76, is wound on a non-magnetic manderal, such as an aluminum manderal. The lead wires 79 (shown in FIG. 2), from the coil 76, are routed to an analog or digital system (not shown) that controls the movement of the moving element 70, and the circuit means provide the actuation currents. The analog or digital controller could be securely attached to the stage 5, or could be at a remote location. The wiring 79, of course has to be securely attached and routed through the moving element 70, to insure proper electrical contact to the coil 76. Lead wires 79, that connect the analog or digital controller to the coil 76, are preferably braided and have a low inductance.

The upper or third fixed assembly or frame 90, is made from a similar material as used to make the lower fixed frame 10. The upper frame 90, has openings 95, to allow for the transmission of an optical or an electrical signal. The central access hole or opening 97, allows for the placement of the work-piece (not shown), into the middle of the upper frame 90, or on to the upper surface of the plate or sheet 72, of the upper moving element 70. The upper frame 90, also has upper spacer 92, and an opening 93, between the upper spacer 92. The peripheral upper edge of the middle assembly or frame 50, mates with the lower surface of the upper spacer 92. The upper spacer 92, can be of any shape, such as rod, blocks, etc., and it can also having opening 93. The opening 93, of course would provide an exit for the air bearing. The opening 93, could be a continuous opening as shown, or a slotted type opening where the opening would have both a structural material and open areas. The frame 90, could also have attached to it one or more optical or other types of sensors (not shown). The frame 90, could also have one or more holes to allow access to the lower surface of the upper sheet or plate 72, of the upper moving element 70. One such hole is shown as central access hole 97.

Precision spacers 92 and 12, built in to the upper and lower assemblies 90, and 10, respectively, determine the air bearing gaps.

The upper return plates 98, are embedded into the upper frame 90, into the openings 94, as shown in FIG. 2. Additionally, FIG. 2 shows the perspective view of the positioning stage, with the upper assembly and primary moving element sandwich structure removed in order to show the coil-to-magnet relationship. Because the magnetic gap is small, the field over the magnet area is considered to be approximately constant, therefore, the magnet width should be greater than or equal to the coil width plus the motion range. Also, the surface of the magnet that faces the moving element could have an electrically conducting foil (not shown) on it to improve transient response.

As can be clearly seen in both FIGS. 1 and 2, the primary moving element 70, is accessible through a large central access opening or hole 97, in the upper fixed frame 90. It is preferred that the coils within each moving element are in the same moving plane but in some situation one or more of the coils within the moving element could be on a different moving plane. Additionally, it is preferred that the moving element itself is rigid in the plane of motion but is flexible out of the plane of motion.

With the addition of a slight extra mass, an extension platform (not shown) could be added to provide a moving stage projecting above the surface of the upper frame 90.

The lower moving element 30, can also be provided with a lower LED 48, or similar sensing device, securely attached to the lower sheet 34. The lower LED 48, transmits an optical signal to the sensor 8, that is securely attached to the lower fixed frame 10, to inform the feedback system of the position or location moving element 70, could also be provided with an upper LED 88, or similar such device, attached to the lower sheet 74, to transmit a signal through the openings 55 and 15, in the middle frame 50, and the lower frame 10, respectively, to the feedback system, that controls the movement of the moving element 70. A similar sensor or transmission device (not shown) could also be attached to the upper surface of the upper sheet 72, of the moving element 70, for transmission of a signal through openings 95, in the upper frame 90, to the sensor (not shown). On the same basis a sensor or a transmission device could also be securely attached to the upper surface of the upper sheet 32, of the lower moving element 30, for transmission of a signal through openings 55 and 95, in the middle and upper frames 50 and 90, respectively, to a sensor (not shown). The sensor would mainly be sensing the X, Y and theta motion of the positioning stage, but it is conceivable that this sensor could be used to detect other parameters as well.

In precision positioning operation, the positions and orientations of the moving elements must be measured in real time. This can be done by any of several methods, including sensing by capacitance, inductance, pneumatic and optical means. The LED and the optical sensing means shown in FIGS. 1 and 2, is one way to measure the acceleration, velocity, position and orientation of the moving elements. A similar optical sensing means with a lateral effect photodiode, has been used in U.S. Pat. No. 4,514,674, "Electromagnetic X-Y-Theta Precision Positioner," by B. Musits and R. Hollis.

The radiation from a single light emitting diode (LED) attached to the moving stage is imaged by an optional lens (not shown) onto the active surface of a lateral effect position sensing photodiode (lateral cell). In this way the position of the moving elements is measured in two dimensions, i.e., X and Y. With the use of two or more LEDs attached to the moving element, the position as well as orientation of the moving elements can be measured, i.e., X, Y and theta. The measured motion range can be scaled up or down by the lens magnification. Motion resolution at the lateral cell surface can be of the order of 0.1 to 1.0 microns in a bandwidth of 20 KHz, with full scale linearity of 1 to 2 percent.

In this preferred embodiment, a pair of LEDs 48 and 88, are rigidly attached to each of the moving elements as shown in FIGS. 1 and 2. The radiation from one or more of these LEDs is focussed by lenses onto the active surfaces of the corresponding lateral effect cells mounted rigidly to the lower assembly or the fixed frame 10. Each lateral cell measures two orthogonal coordinates of the light spot focussed on its surface, and a simple mathematical translation then yields both the X-Y translation and the theta rotation of each moving element.

An alternative procedure is to use a single lateral cell for each moving element, combined with a pair of flashing LEDs mounted on each moving element as disclosed in IBM Technical Disclosure Bulletin, Volume 30, Number 7, pages 33-34, December 1987, entitled "Non-contact Sensor for Two-Dimensional Translation and Rotation."

For accurate tracking of desired trajectories and movement to desired positions and angles without overshoot, some form of closed loop control must be implemented. The control means can take the form of analog circuits, or a combination of analog and digital circuits. Programmable microprocessors or Digital Signal Processors (DSPs) can be used if they are fast enough. Briefly considered are possible control strategies suitable for point-to-point moves, sine wave scanning and constant velocity scanning.

FIG. 3, shows the sectional view 3—3, taken from FIG. 2. For the highest obtainable energy product, NdFeB magnets are preferred with ferrous return plates 18 and 98, to form a closed magnetic structure. The drive coils are wound from rectangular cross section, preferably aluminum wires, as aluminum wires provide the highest overall performance. The coils 36 and 76, and structural material 38 and 78, are sandwiched between thin graphite or Kevlar (A Trademark of E. I. du Pont De Nemours & Co., Wilmington, Del., U.S.A.) or beryllium or titanium or reinforced epoxy panels to create a strong, lightweight structures. As stated earlier this structure could be a hollow structure having an opening 37 and 77. Both the upper or primary and lower or recoil moving elements, 70 and 30, respectively, are constrained from the top and bottom sides by air bearings. The pressurized air for the air bearing is built in to the upper, middle, and lower assemblies or frames 90, 50 and 10, respectively.

The one or more lower air bearing air inlets 45, allow for the entrance of the air that is brought through the lower fixed frame 10, through the one or more air inlets 22. The one or more air bearing orifice or air outlets 40, allow for the exit of the air that is brought through the air inlet 45. The one or more middle air bearing air inlets 65, allow for the entrance of the air that is brought through the middle fixed frame 50, through the one or more air inlets 52. The one or more air bearing orifice or air outlets 60, allow for the exit of the air that is brought through the air inlet 65. The one or more upper air bearing air inlets 85, allow for the entrance of the air that is brought through the upper fixed frame 90, through the one or more air inlets 102. The one or more air bearing orifice or air outlets 80, allow for the exit of the air that is brought through the air inlet 85. Air has been used as an example, but other fluids could as easily have been used, such as, argon, chlorofluorocarbon, fluorocarbon, helium, or nitrogen to name a few. If a chlorofluorocarbon is used then trichlorofluoromethane or dichlorodifluoromethane (Nos. 11 and 12, respectively) would be preferred. In case of a fluorocarbon, any of the fluorocarbon such as tetrafluoromethane (No. 14), dichlorofluoromethane (No. 21), or hexafluoroethane (No. 116), to name a few, would be acceptable. When any of the above-mentioned fluid is brought into the positioning stage through any of the air inlets 45, 65 or 85, and the temperature of the incoming fluid is lower than the stage temperature then the coil's electrical resistance would be lowered. The fluid that is brought into the stage through any of the fluid inlets 45, 65 and 85, not only provide the necessary fluid or air bearing but also provide means for cooling the moving element and the coils.

The air that is injected into the stage 5, through the air inlets 45, 65 and 85, force the lower or first moving element 30, and the upper or second moving element 70, to lift and remain suspended in air during operation. When the moving elements are suspended in air then there is very little friction to effect the rotational and translational movement of the first and second moving elements. The air that is brought into the system exits through one or more of the openings 13 and 93. Therefore, the air pressure that is exerted onto the moving elements 30 and 70, has to be properly adjusted based upon the cross-sectional area of the openings 13 and 93, and the inlet pressure at air inlets 45, 65 and 85.

The recoil or lower moving element 30, has lower coils 36, cavity 37, having structural material 38, embedded or sandwiched between the upper and lower sheets 32 and 34. Similarly, the upper coil 76, is sandwiched or embedded between the upper and lower sheets 72 and 74, of the upper moving element 70. The magnetic flux path or direction is indicated by the arrows 99. Of course the direction of the magnetic flux path depends on the way the magnets are placed.

Air bearings provide an almost ideal constrainment means for the moving elements. They can provide very stiff support, and have zero static friction. Port or air inlet 22, 52 and 102, in the lower, middle, and upper fixed assemblies 10, 50 and 90, respectively, brings pressurized air into the lower, middle and upper air bearing orifices 40, 60 and 80, respectively, creating a thin (approx. less than 10 micron) film above and below each of the moving elements. The design of these bearings depends on several factors, including the desired stiffness, load bearing and air flow rates.

A secondary, but important, feature of the air bearings used in this invention is their ability to provide cooling for the drive coils. In high speed operation, many watts of power are dissipated as heat in the coils. Much of this heat can be removed by the escaping air film. This air can be chilled to further act as a cooling means, or some other fluid such as nitrogen could be used. Boiloff from liquid nitrogen could also be used. A further benefit of cooling is a lowering of electrical coil resistance, and therefore, in some case, the temperature of inlet fluid would be lower than the temperature of the positioning stage. The positioning stage would preferably be cooled from the inside fluid outlets, but another way to cool the stage would be from the outside.

Figure 6:
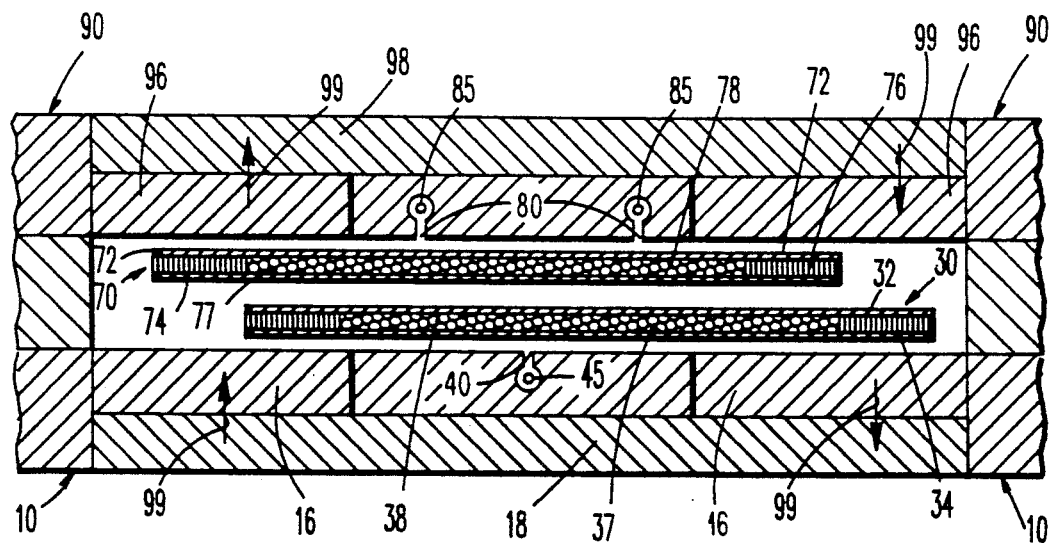
FIG. 6 is a cross-sectional elevational view of an assembled positioning stage showing another embodiment and made according to this invention.

The operation of the device in translation and rotation is shown in both FIGS. 3 and 6.

If for example, the primary moving element 70, is translated to the upper right hand limit of its excursion, simultaneously, the recoil moving element 30, underneath is translated to its lower left hand limit, resulting in complete cancellation of linear momentum transmitted to the Positioning Stage 5. A small residual torque is generated because the location of the centers of gravity of the two moving masses differ a small amount in the z direction. Even this small residual torque can be cancelled by adding pairs of "wings" which extend downward from the primary moving element 70, and upward from the recoil moving element 30, to create coplanar centers of gravity.

If, for example, the device operation is for a rotation of 5 degrees. Then the primary moving element 70, has to be rotated +5 degrees, while the recoil moving element 30, will automatically rotate −5 degrees, resulting in a complete cancellation of the angular momentum transmitted to the Positioning Stage 5. In general, a combination of rotation and translation might be executed by both primary and recoil moving elements, as required.

Figure 4:
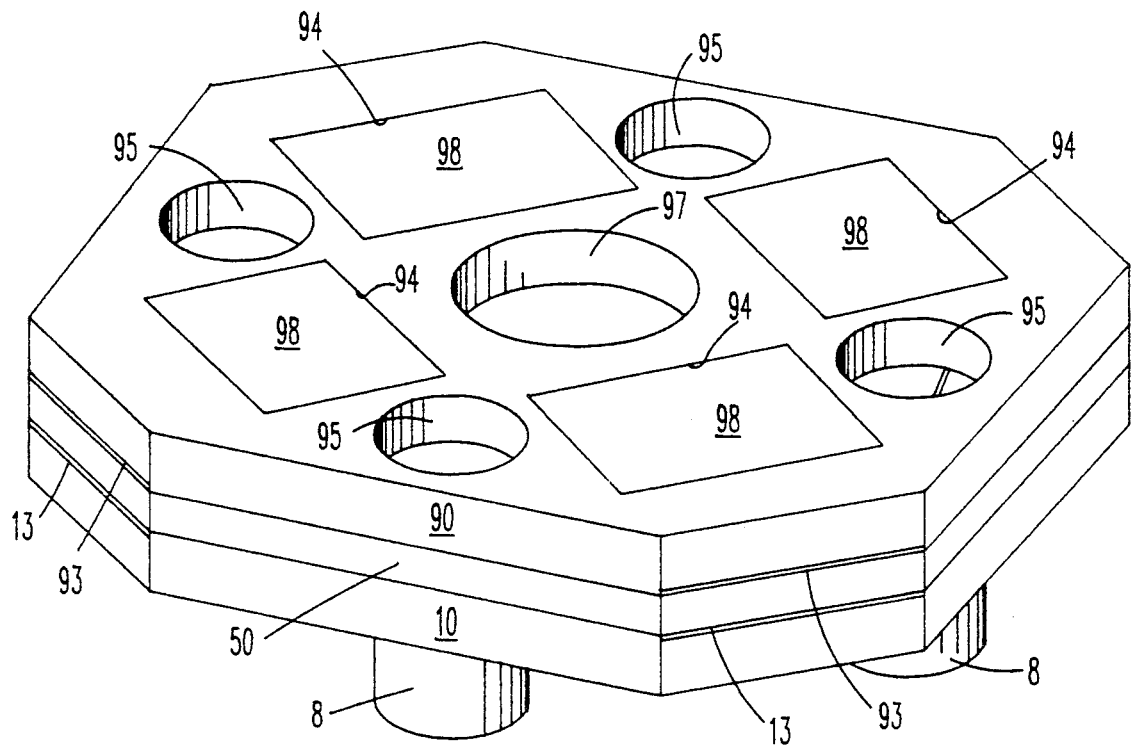

FIG. 4, shows a fully assembled positioning stage of this invention, and it is shown with the different parts. It can also be clearly seen that the openings 13 and 93, that are formed when the positioning stage of this invention is fully assembled.

Figure 5A:
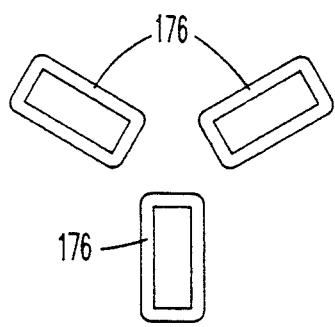
FIGS. 5A, 5B and 5C are a schematic plan view showing some of the possible configurations for the coils of the positioning stage made according to this invention.
Figure 5B:
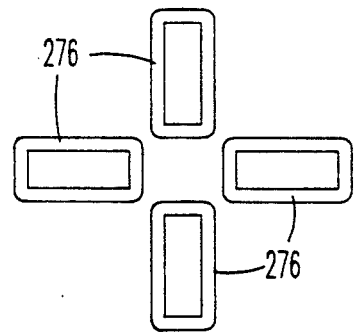
Figure 5C:
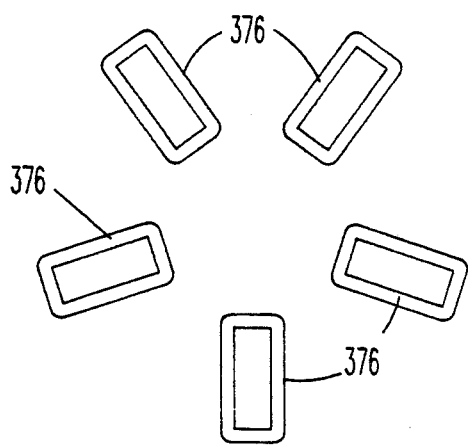

As stated earlier many coil configurations are possible and some of the preferred configurations are illustrated in FIGS. 5A, 5B and 5C. These are some possible coil configurations, but many other variations are possible. FIG. 5A, shows the coils 176, arranged in a three-star configuration, while FIG. 5B, has the coils 276, arranged in a four-star configuration The four-star configuration is also the one that has been discussed in connection with the preferred embodiment of this invention. A five-star configuration is shown in FIG. 5C, showing the coils 376.

Furthermore, the middle assembly 50, could be eliminated entirely, as shown in FIG. 6. In this case the upper moving element 70, and the lower moving element 30, would be held inside the upper and lower frame 90 and 10, and would only be separated by an airgap.

An important consideration for smooth control is the force to current ratio over the operating range of the actuator. For an electrodynamic actuator, this ratio will be approximately constant if either (a) the coil is larger than the constant field region plus the motion range, or (b) the constant field region is larger than the coil plus the motion range. Either case yields a constant force to current ratio, however choice (b) minimizes the resistance, inductance and moving mass.

For high-speed point-to-point moves with known payloads (such as in electrical probing applications), a "bang-bang" approach is appropriate, which involves a full positive current for the first half of the move and is followed by full negative current for the second half. A current servo is used with saturated power supply voltages. The switchover time could be determined from accurate modelling or experimentation and would be designed to leave the stage with some very small velocity near the end of the point-to-point move. A final, proportional or PID (proportional integral derivative) mode could then be used to null the residual error in position and rotation.

Sine wave X-Y scanning for microscopy applications has the advantage of retaining an unsaturated, linear drive with smooth (sinusoidal) waveforms for acceleration, velocity, and position. The X-Y motion might best be done open-loop, with some degree of over scanning to improve linearity over the sample dimensions. The position sensors would then provide information for image generation. A difficulty arises due to unwanted rotation. For rotation, closed loop theta correction could be superimposed on the open-loop scanning motion.

For constant velocity scanning (e.g., for certain metrology applications) a velocity servo is essential. Velocity sensors can be added to the Positioning Stage, or the back EMF can be used as a measure of velocity, or the velocity can be estimated from the position sensors. One such way to estimate the velocity from the position sensors could be generated from an observer model running in a microprocessor.

For the control modes mentioned so far, the general interest has been in controlling only the primary moving element. During the primary moving element motion, a companion control would be executed for the recoil moving element. This can duplicate the primary control, or more interestingly, can be somewhat different. For example, if position control is used for the primary moving element, the recoil moving element can be controlled not for position, but to track the acceleration of the primary stage or use information from an accelerometer mounted to the frame, thus actually serving out residual momentum. Other control modes are possible, including ones where the compliance (stiffness) of the device, or its applied force can be varied.

EXAMPLES

The following examples are intended to further illustrate the invention and are not intended to limit the scope of the invention in any manner.

EXAMPLE 1

The Ultrafast Electro-Dynamic X, Y and Theta Positioning Stage made according to the teachings of this invention can be of any size and/or dimensions. For this example, the Positioning Stage made according to the teachings of this invention is illustrated to be approximately 158 mm (6.25 in.) wide, 158 mm (6.25 in) long and 38.1 mm (1.5 in.) high, and is intended to have an operating range in the X-Y plane of 12.7 mm by 12.7 mm (0.5 in. by 0.5 in.). The result would be a device whose motion range is only about 1/12 of its length and whose moving mass is but a tiny fraction of its fixed mass.

Because the magnetic gap is small, the field over the magnet area is considered to be approximately constant, therefore the magnet width should be greater than or equal to the coil width plus the motion range. In this design the coil width is 6.35 mm (0.25 in.), the motion range is 12.7 mm (0.5 in.), and the magnet width is 19.05 mm (0.75 in.). Similarly, since the coil ends produce no useful forces, the magnet length should be equal to the coil length minus the motion range, as can be seen in FIG. 1.

Glass reinforced epoxy board or sheet, are preferably used for sheet 32, 34, 72 and 74, but graphite or Kevlar reinforced epoxy would also be acceptable as the sheet or board material.

If aluminum is used, then the mass of each aluminum coil is 3.99 gm, and therefore the mass of four coils, would be approximately 16.0 gm. The mass of the composite star is then equal to 8.4 gm and for 2 sheets it is 16.8 gm. Therefore the total mass M=32.8 gm (mass of the two sheets including the coils) +9.2 gm (mass of the adhesive and leads) =42 gm.

If copper coils are used instead, then the mass of each copper coil will be 13.2 gm and for four coils, the mass is 52.8 gms. The mass for the two sheets as calculated above is 16.8 gm, and therefore, the total mass M=69.6 gm (mass of the two sheets including the coils) +10.4 gm (mass of adhesive and leads) =80.0 gm. For this example, considerably higher performance is obtained by using aluminum versus copper coils.

Using 0.25 inch thick NdFeB magnets (35 MGOe), an average gap field of about 7 KG=0.7 weber/m$^2$, or more is obtained.

The effective length of a 4 mil wire having a 0.5 mil insulation is found to be 31.75 mm×100 (turns) =3175 mm=3.175 m. The force per coil is 0.7 weber/m$^2$×3.175 m=2.22 N/A per coil.

The maximum force in a direction perpendicular to the coil long axes occurs when two coils are on (and two are off):

$$F_{max} = 2 \times 2.22 = 4.44 \ N/A.$$

The maximum possible acceleration is given by the force to mass ratio:

$$a = F/M \ 32 \ (4.44 \ N/A)/(0.042 \ Kg) = 106 \ m/sec^2 A.$$

In g's this is 106/9.8=10.8 g's/A. Currents of many amperes are possible for short times in coils of this type.

Assuming adequate voltage sources, the current rise time in the coils is determined by the L/R time constant, where L and R is the inductance and resistance, respectively, of the coil. The resistivity of Al is $2.8 \times 10^{-8}$ Ohm-meter, Cu is $1.7 \times 10^{-8}$ Ohm-meter. For this example the coil resistance R was calculated to be 1.24 Ohms. The inductance L of the coil is about 0.3 mH. From these values, the time constant (tau) is about $$tau = L/R = 0.24 \, msec.$$

Since power amplifiers capable of delivering over 40 V at 20 A, with slew rates of about 1 V/microsec are available, the coil time constant would be the limiting factor on current rise time.

The device performance for sine wave scanning is governed by the relation:

$$a(max) = A \, omega^2 = A(2 \, pi \, f)^2$$

where $a_{max}$ is the maximum acceleration, A is the position amplitude, and f is the frequency (in Hz) of excitation. For a sinusoidal current:

$$i = i_{max} \sin(omega \times t)$$

the instantaneous power dissipated in the coils (ignoring inductance) is:

$$P = i_{max}^2 R \sin^2(omega \times t),$$

and the average power is, $$P_{avg} = i_{max}^2 R/2.$$

If we arbitrarily limit the device power dissipation to, say, $P_{avg} = 100$ W, then with R=1.24 ohms, the maximum current will be $i_{max} = 12.7$ A. With this $i_{max}$, $a_{max} = 1343$ m/sec$^2 = 137$ g's. Thus, for 100 W power dissipation, the position amplitude is given by $$A = a_{max}/(2 \times pi \times f)2 = 34.1/f^2.$$

For scanning frequencies below approximately f=70 Hz, the full 6.35 mm motion amplitude can be used. At f=500 Hz, the motion amplitude is 0.14 mm. It is interesting to compute the amplitude for a frequency f =15,750 Hz, as this is the horizontal scan frequency for standard American television. For this frequency, the amplitude is 0.137 microns or 1370 angstrom. Thus it is possible to implement a real-time scanning tunneling microscope with ordinary TV output.

To illustrate the point-to-point motion performance of which this device is capable, we consider a typical 10 mm motion, which is 79 percent of the design maximum motion range of this example. The objective is to move from point A to point B in the smallest possible elapsed time.

The optimum open-loop drive strategy for minimum move time is to send full positive drive current through the coils for half the move distance, bringing the device to peak velocity, followed by full negative drive current for the remaining distance, bringing it to a complete stop. Of course, due to unmodelled dynamics, closed loop control would be used to insure that the objectives were met.

Using this strategy, at time zero, the amplifier voltage slews rapidly to the upper voltage limit. For this example, voltage and current limits were arbitrarily set at ±40 V and ±10 A, respectively. The voltage remains pegged at the maximum until the current slews (responding to time constant tau) to 10 A. The voltage then rapidly decreases to about 12.4 V, in accordance with the coil resistance R. Thus the current stabilizes at 10 A in approx. 0.1 msec. This current is maintained from 0.1 msec to approx. 3.2 msec, as the voltage slowly increases to compensate for the coil back EMF. At a time slightly before the mid-time of the move the amplifier voltage is reversed, and stays pegged at the lower limit until the current is stabilized at −10 A. Finally, at approx. 6.4 msec. the current is brought back to zero, completing the move.

Peak accelerations of ±1058 m/sec$^2 = 108$ g's are maintained during most of the move. A peak velocity of approx. 3.3 m/sec is reached at the midpoint of the move (5 mm). The entire 10 mm move from start to stop is completed in approx. 6.4 msec. Inverting this time, we see that 156 such moves could be executed in one second.

An important consideration is the electrical power dissipated in the coils. In this example, a steady expenditure of 124 W is incurred, divided over two active coils (i.e., 62 W per coil). In terms of radiative surface, this is a power density of about 3.3 W/cm$^2$. With the use of high temperature insulation, plus air cooling from the bearings, it is reasonable that this power level could be sustained.

Note that in these examples of sine wave scanning and point to point motion, only two of the four coils were energized. Referring to FIG. 1, it is clearly better to move in directions 45 degree from the coil long axes. The total current is reduced by a factor of one over square root of 2, which cuts the total power in half and distributes it over all four coils. This means the power density could be cut by a factor of 4.

EXAMPLE 2

This invention could also be used for both point-to-point continuity tests and single-point short circuit tests that have to be performed on substrates or on electrical packages. There may be many thousands of via points on a substrate which could be visited by a two-arm robot, if it were fast enough. An ultrafast positioning stage according to this invention could be mounted on each arm of the robot, forming a coarse-fine system similar to those which have been described. The positioning stage could be equipped with a small electrical probe, with almost no sacrifice in performance. Since the invention described here is capable of rapidly moving over an entire test site on the substrate, the coarse robot would merely be required to move to and stop at each of the specific test sites. At each site the ultrafast positioning stage would move to each of the via points within the test site.

In order to evaluate the performance of such a system, the same parameters were used as in Example 1, dealing with point-to-point move performance. Results yield point-to-point move times of 1.0 msec, which means a complete test site having for example, 1000 points could be tested in about one second. Even though accelerations of over 100 g's are used for each move, no reaction forces are transmitted to the coarse robot, enabling it to accurately maintain its position.

Generally, in applications involving thousands of test points which do not happen to cluster at test sites, the coarse robot could just slowly "cruise" along some general path without even stopping while the ultrafast stage rapidly picks off the points while also compensating for the coarse motion.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A precision positioning stage capable of executing multi-dimensional planar motion comprising:
   a) at least one fixed assembly, said fixed assembly comprising at least a first part and at least a second part, said first and said second part having at least one magnet secured thereto, such that at least a portion of said magnets are close enough to magnetically influence at least a portion of at least one first moving element, and wherein said first and said second part are on the opposite sides of said at least one first moving element,
   b) said at least one first moving element has at least one coil that can be electrically energized, and wherein said at least one first moving element is not physically connected to said fixed assembly, and wherein said fixed assembly has means for making said at least one first moving element float within said fixed assembly, wherein said at least one first moving element moves with respect to said fixed assembly at high speed when electrically energized, and wherein the momentum of said moving element is instantaneously opposed to prevent momentum from being transferred to said fixed assembly, thereby providing said precision positioning stage.

2. The precision positioning stage of claim 1, wherein at least one second moving element provides said instantaneous momentum opposition.

3. The precision positioning stage of claim 1, wherein said fixed assembly and said moving element forms a motor, and wherein the motion of said moving element is measured by a sensor, said sensor provides information to a controller means and wherein said controller insures that a desired motion is achieved.

4. The precision positioning stage of claim 1, wherein said moving element is juxtapositioned with said fixed assembly in a friction minimizing manner.

5. The precision positioning stage of claim 2, wherein circuit means provide actuation currents.

6. The precision positioning stage of claim 2, wherein each of said moving elements have at least one coil interacting with a magnetic field and at least one coil from said each moving element shares the same magnetic field.

7. The precision positioning stage of claim 1, wherein said magnets in said fixed assembly are either a permanent magnet or an electromagnet.

8. The precision positioning stage of claim 7, wherein at least one said magnet has an electrically conducting foil over the surface that faces said moving element.

9. The precision positioning stage of claim 2, wherein at least one of said moving element has at least three coils and wherein at least two of said coils are in the same plane.

10. The precision positioning stage of claim 2, wherein at least one of said moving element has at least three coils and wherein at least one of said coil is in a different plane.

11. The precision positioning stage of claim 2, wherein at least one of said moving element is rigid in the plane of motion but flexible out of the plane of motion.

12. The precision positioning stage of claim 1, wherein said moving element has at least one coil, said coil is supported by a structure and wherein said structure covers at least a portion of said moving element.

13. The precision positioning stage of claim 1, wherein said moving element has a coil and said coil is cooled by a fluid.

14. The precision positioning stage of claim 13, wherein said fluid is selected from a group comprising air, argon, chlorofluorocarbon, fluorocarbon, helium or nitrogen.

15. The precision positioning stage of claim 13, wherein the temperature of said cooling fluid is lower than the temperature of said positioning stage.

16. The precision positioning stage of claim 1, wherein a position sensor is secured to said stage.

17. The precision positioning stage of claim 16, wherein said sensor senses X, Y and theta motion.

18. The precision positioning stage of claim 1, wherein the movement of said moving element is analog or digital controlled.

19. The precision positioning stage of claim 2, wherein the movement of said second moving element is analog or digital controlled.

20. The precision positioning stage of claim 2, wherein the mass of said moving element is the same as the mass of said second moving element.

21. The precision positioning stage of claim 2, wherein the mass of said moving element is different than the mass of said second moving element.

22. The precision positioning stage of claim 1, wherein said moving element is acceleration, position or velocity controlled.

23. The precision positioning stage of claim 2, wherein said second moving element is acceleration, position or velocity controlled.

24. The precision positioning stage of claim 1, wherein said precision positioning stage has fluid bearing means.

25. The precision positioning stage of claim 24, wherein said fluid is selected from a group comprising air, argon, chlorofluorocarbon, fluorocarbon, helium and nitrogen.

26. The precision positioning stage of claim 24, wherein said fluid bearing means also provide cooling means for said precision positioning stage.

27. The precision positioning stage of claim 24, wherein said fluid bearing means also provide cooling means for said moving element.

28. The precision positioning stage of claim 24, wherein the temperature of said fluid is lower than the temperature of said positioning stage.

29. A precision positioning stage capable of executing multi-dimensional planar motion comprising:
a) a first fixed assembly, said first fixed assembly having at least one magnet secured thereto, such that at least a portion of said magnet is close enough to magnetically influence at least a portion of at least one first moving element,
b) said at least one first moving element has at least one coil that can be electrically energized,
c) at least one second fixed assembly, said first moving element being contained within said first and said second fixed assemblies, said second fixed assembly having at least one magnet secured thereto, such that at least a portion of said magnet is close enough to magnetically influence at least a portion of said at least one first moving element and at least a portion of at least one second moving element,
d) said at least one second moving element has at least one coil that can be electrically energized,
e) a third fixed assembly, such that said second moving element is contained within said second and said third fixed assemblies, said third fixed assembly having at least one magnet secured thereto, such that at least a portion of said magnet is close enough to magnetically influence at least a portion of said at least one second moving element, said first and second moving elements are not physically connected to any of said assemblies, and wherein at least two of said fixed assemblies have means for making said first and said second moving elements float within said fixed assemblies, and wherein said first moving element moves in a momentum cancelling manner with respect to said second moving element when said coils are electrically energized.

30. The precision positioning stage of claim 29, wherein at least three coils are securely held inside at least one of said moving elements.

31. The precision positioning stage of claim 29, wherein said moving elements have at least one coil, and said fixed assemblies have at least one magnet.

32. The precision positioning stage of claim 31, wherein at least one of said magnet has an electrically conducting foil over the surface that faces at least one of said moving elements.

33. The precision positioning stage of claim 29, wherein said precision positioning stage has fluid bearing means.

34. The precision positioning stage of claim 33, wherein said fluid is selected from a group comprising air, argon, chlorofluorocarbon, fluorocarbon, helium and nitrogen.

35. The precision positioning stage of claim 33, wherein said fluid bearing means also provide cooling means for said precision positioning stage.

36. The precision positioning stage of claim 33, wherein said fluid bearing means also provide cooling means for at least one of said moving elements.

37. The precision positioning stage of claim 33, wherein the temperature of the inlet fluid is lower than the temperature of said positioning stage.

38. The precision positioning stage of claim 29, wherein a position sensor is securely attached to said precision positioning stage.

39. The precision positioning stage of claim 29, wherein said fixed assemblies and said moving elements form a motor, and wherein the motion of at least one of said moving element is measured by a sensor, said sensor provides information to a controller means and wherein said controller insures that a desired motion is achieved.

40. A precision positioning stage capable of executing multi-dimensional planar motion comprising:
a) a first fixed assembly, said first fixed assembly having at least one magnet secured thereto, such that at least a portion of said magnet is close enough to magnetically influence at least a portion of at least one first moving element,
b) said at least one first moving element has at least one coil that can be electrically energized,
c) at least one second moving element, said at least one second moving element has at least one coil that can be electrically energized,
d) a second fixed assembly, such that said first and said second moving elements are contained within said first and said second fixed assemblies, said second fixed assembly has at least one magnet secured thereto, such that at least a portion of said magnet is close enough to magnetically influence at least a portion of said at least one second moving element, said first and second moving elements are not physically connected to any of said assemblies, and wherein at least two of said fixed assemblies have means for making said first and said second moving elements float within said fixed assemblies, and wherein said first moving element moves in a momentum cancelling manner with respect to said second moving element when said coils are electrically energized.

41. The precision positioning stage of claim 40, wherein at least three coils are securely held inside at least one of said moving elements.

42. The precision positioning stage of claim 40, wherein said moving elements have at least one coil, and said fixed assemblies have at least one magnet.

43. The precision positioning stage of claim 42, wherein at least one of said magnet has an electrically conducting foil over the surface that faces at least one of said moving elements.

44. The precision positioning stage of claim 40, wherein said precision positioning stage has fluid bearing means.

45. The precision positioning stage of claim 44, wherein said fluid is selected from the group comprising air, argon, chlorofluorocarbon, fluorocarbon, helium or nitrogen.

46. The precision positioning stage of claim 44, wherein said fluid bearing means also provide cooling means for said precision positioning stage.

47. The precision positioning stage of claim 44, wherein said fluid bearing means also provide cooling means for at least one of said moving elements.

48. The precision positioning stage of claim 44, wherein the temperature of said fluid is lower than the temperature of said positioning stage.

49. The precision positioning stage of claim 40, wherein a position sensor is securely attached to said precision positioning stage.

50. The precision positioning stage of claim 40, wherein said fixed assemblies and said moving elements form a motor, and wherein the motion of at least one of said moving element is measured by a sensor, said sensor provides information to a controller means and wherein said controller insures that a desired motion is achieved.

* * * * *